US009996015B2

(12) United States Patent
Prochnau et al.

(10) Patent No.: US 9,996,015 B2
(45) Date of Patent: Jun. 12, 2018

(54) MIRROR MODULE, IN PARTICULAR FOR A MICROLITHOGRAPHIC PROJECTION EXPOSURE APPARARATUS

(71) Applicant: Carl Zeiss SMT GmbH, Oberkochen (DE)

(72) Inventors: Jens Prochnau, Oberkochen (DE); Dirk Schaffer, Jena (DE); Andreas Wurmbrand, Aalen (DE); Bernhard Gellrich, Aalen (DE); Markus Kern, Westhausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/432,082

(22) Filed: Feb. 14, 2017

(65) Prior Publication Data

US 2017/0153552 A1 Jun. 1, 2017

Related U.S. Application Data

(63) Continuation of application No. PCT/EP2015/069026, filed on Aug. 19, 2015.

(30) Foreign Application Priority Data

Aug. 21, 2014 (DE) ........................ 10 2014 216 631

(51) Int. Cl.
*G03B 27/54* (2006.01)
*G03F 7/20* (2006.01)
(Continued)

(52) U.S. Cl.
CPC ......... *G03F 7/7095* (2013.01); *G02B 5/0891* (2013.01); *G02B 7/181* (2013.01); *G03F 7/709* (2013.01); *G03F 7/70883* (2013.01)

(58) Field of Classification Search
CPC ................. G03F 7/70975; G03F 7/70891
(Continued)

(56) References Cited

U.S. PATENT DOCUMENTS 9,316,929 B2 * 4/2016 Baer .................. G03F 7/70891
2002/0017616 A1 2/2002 Ota
(Continued)

FOREIGN PATENT DOCUMENTS

DE   102009045163 A1   4/2011
DE   102010028488 A1   11/2011
(Continued)

OTHER PUBLICATIONS

International Preliminary Report on Patentability for corresponding PCT Appl No. PCT/EP2015/069026, dated Mar. 2, 2017.
German Office action, with translation therein, for corresponding DE Appl 10 2014 216 631.4, dated Feb. 11, 2015.
International Search Report and Written Opinion for corresponding PCT Appl No. PCT/EP2015/069026, dated Nov. 24, 2015.
(Continued)

*Primary Examiner* — Hung Henry Nguyen
(74) *Attorney, Agent, or Firm* — Fish & Richardson P.C.

(57) ABSTRACT

The disclosure relates to a mirror module, in particular for a microlithographic projection exposure apparatus, including a mirror, which has a mirror body and an optically effective surface. The mirror body has a first material, and a supporting structure for connecting the mirror body to an objective structure. The supporting structure has a second material. The first material and the second material differ in terms of their coefficients of thermal expansion by less than $0.5*10^{-6} K^{-1}$ in a temperature range around an operating temperature which is reached by the mirror module during operation in the region of the connection of the mirror body to the supporting structure.

20 Claims, 4 Drawing Sheets

(51) Int. Cl.
*G02B 5/08* (2006.01)
*G02B 7/18* (2006.01)

(58) Field of Classification Search
USPC .................................................. 355/53, 67
See application file for complete search history.

(56) References Cited

U.S. PATENT DOCUMENTS

| | | |
|---|---|---|
| 2004/0165161 A1 | 8/2004 | Hara |
| 2008/0291416 A1 | 11/2008 | Nishikawa |
| 2009/0219497 A1 | 9/2009 | Schoeppach et al. |
| 2011/0165522 A1 | 7/2011 | Mann et al. |
| 2012/0182533 A1 | 7/2012 | Schoeppach et al. |
| 2013/0120863 A1 | 5/2013 | Kaller et al. |
| 2013/0141707 A1 | 6/2013 | Baer et al. |

FOREIGN PATENT DOCUMENTS

| | | |
|---|---|---|
| DE | 10 2012 202 1 | 8/2013 |
| EP | 1477855 A1 | 11/2004 |
| EP | 1542076 A2 | 6/2005 |
| JP | 2000208406 | 7/2000 |
| WO | WO 2012/013746 | 2/2012 |
| WO | WO 2013/120839 A2 | 8/2013 |

OTHER PUBLICATIONS

Chu Chang-Bo et al., "Design of Bipod Flexures for Space Mirror", SPIE, vol. 8196, Aug. 15, 2011, 11 pages.

* cited by examiner

MIRROR MODULE, IN PARTICULAR FOR A MICROLITHOGRAPHIC PROJECTION EXPOSURE APPARARATUS

CROSS-REFERENCE TO RELATED APPLICATIONS

The present application is a continuation of, and claims benefit under 35 USC 120 to, international application PCT/EP2015/069026, filed Aug. 19, 2015, which claims benefit under 35 USC 119 of German Application No. 10 2014 216 631.4, filed Aug. 21, 2014. The entire disclosure of international application PCT/EP2015/069026 and German Application No. 10 2014 216 631.4 are incorporated by reference herein.

FIELD

The disclosure relates to a mirror module and to a microlithographic projection exposure apparatus including such a mirror module.

BACKGROUND

Microlithography is used to produce microstructured components, such as, for example, integrated circuits or LCDs. The microlithography process is performed in a so-called projection exposure apparatus, which has a lighting device and a projection lens. The image of a mask (=reticle) illuminated via the lighting device is in this case projected via the projection lens onto a substrate (for example a silicon wafer) which is coated with a light-sensitive layer (photoresist) and is arranged in the image plane of the projection lens, in order to transfer the mask structure onto the light-sensitive coating of the substrate.

In projection lenses designed for the EUV range, i.e. in the case of wavelengths of approximately 13 nm or approximately 7 nm, for example, mirrors are used as optical components for the imaging process owing to a lack of availability of suitable light-transmissive refractive materials.

These mirrors have a mirror body (for example consisting of a glass ceramic) and a reflective coating. Owing to the small size of the structures to be imaged, stringent requirements are placed on the imaging properties of the projection system. Imaging errors can only be tolerated to a very small extent.

Mirror modules for use in the EUV range with mirrors which cannot be regulated within all six degrees of freedom via actuators in respect of their position ("unregulated mirrors") are generally designed in such a way that the mirror is connected to an objective structure via a plurality of coupling elements. The coupling elements substantially have the task of compensating for different thermal expansions owing to different coefficients of thermal expansion (CTE) between the mirror and the objective structure and transmitting the holding forces required for connecting the mirror and the objective structure. These coupling elements can be manufactured from different materials. Special metallic coupling elements provide relatively low coefficients of thermal expansion but they are more magnetostrictive in comparison with non-metallic coupling elements.

SUMMARY

The disclosure seeks to provide a mirror module which, when incorporated in a microlithographic projection exposure apparatus, causes as few imaging errors as possible.

A mirror module according to the disclosure, in particular for a microlithographic projection exposure apparatus, has:
a mirror, which has a mirror body and an optically effective surface, wherein the mirror body has a first material; and
a supporting structure for connecting the mirror body to an objective structure, wherein the supporting structure has a second material;
wherein the first material and the second material differ in terms of their coefficients of thermal expansion (CTE) by less than $0.5*10^{-6}K^{-1}$ in a temperature range around an operating temperature which is reached by the mirror module during operation in the region of the connection of the mirror body to the supporting structure.

In accordance with one embodiment, the first material and the second material differ in terms of their coefficients of thermal expansion (CTE) by less than $0.3*10^{-6}K^{-1}$, in particular by less than $0.1*10^{-6}K^{-1}$ in this temperature range.

In accordance with one embodiment, the temperature range includes a range of ±1 K, in particular ±5 K, further in particular ±10 K, around the operating temperature.

In accordance with one embodiment, the first material and the second material are different from one another.

In accordance with one embodiment, the second material has a stiffness (or rigidity) which is greater than the stiffness (or rigidity) of the first material by a factor of at least 1.1, in particular at least 1.2, further in particular at least 1.5.

The disclosure is based in particular on the concept of realizing a particularly rigid supporting structure in order to keep unavoidable constraining forces, which can be attributed to the differences in the coefficient of thermal expansion existing between the supporting structure and the mirror body, away from the mirror body in the case of temperature changes. At the same time, a material with a thermal expansion which is as low and homogeneous as possible or an optimum characteristic in respect of the so-called "zero crossing temperature" can be selected for the material of the mirror body (wherein these materials typically have a comparatively low stiffness).

The disclosure is based on the further consideration that the implementation of a particularly rigid supporting structure can take place by the provision of a supporting structure with a correspondingly large volume or a corresponding geometry, but this is associated with increased material and manufacturing costs and an increased installation space requirement. In contrast, the disclosure pursues the concept of providing a particularly rigid supporting structure by targeted selection of the materials used, wherein suitable joints can be provided between the supporting structure and the mirror body.

The first material of the mirror body can be, for example, titanium dioxide ($TiO_2$)-doped quartz glass, wherein, by way of example, the material marketed under the trademark designation ULE® (Corning Inc.) can be used. Furthermore, the glass ceramic material marketed under the trademark designation Zerodur® (Schott AG) can also be used. In accordance with the disclosure, suitable materials for the supporting structure are in particular cordierite, Zerodur® and amorphous quartz glass ($SiO_2$).

In the case of the production of the mirror body from ULE (as first material), a value of 1.33 results for the ratio of the modulus of elasticity of the second material of the supporting structure to the modulus of elasticity of the first material when using Zerodur as the second material, and a value of 2.1 results when using cordierite as the second material.

When producing the mirror body from Zerodur (as first material), a ratio of the moduli of elasticity of 1.55 results for the use of cordierite as the second material.

Preferably, owing to the particularly rigid formation of the supporting structure in accordance with the disclosure, deformations (i.e. local shifts) occurring during operation at the connection point between the supporting structure and the objective structure, for example during heating of the arrangement, are only transferred to the connection point between the supporting structure and the mirror body in a quantity of less than 0.1%. In other words, the supporting structure is preferably configured to be so rigid that of deformations (for example thermally induced deformations) which occur in the region between the supporting structure and the objective structure, only less than 0.1% occur at the connection point between the supporting structure and the mirror body.

In accordance with one embodiment, at least one decoupling element is arranged between the supporting structure and the mirror body. In particular, a plurality of decoupling elements can also be provided. The at least one decoupling element can be configured as a pin, purely by way of example. In further embodiments, the at least one decoupling element can also be formed monolithically with the supporting structure.

Furthermore, additional elements such as bushes, for example, can also be arranged between the supporting structure and the mirror body (i.e. the supporting structure and the mirror body do not necessarily need to be directly connected to one another).

In accordance with one embodiment, the mirror module is configured for an operating wavelength of less than 30 nm, in particular, less than 15 nm.

The disclosure furthermore also relates to a microlithographic projection exposure apparatus which has a mirror module having the above-described features.

In accordance with one embodiment, the minimum spacing between the connection between the objective structure and the supporting structure and the centre point of the optically effective surface is greater than the minimum spacing between the connection between the supporting structure and the mirror body and the optically effective surface by a factor of at least 1.5, in particular by a factor of 2, further in particular by a factor of 3.

As a result, when viewed from the mirror body, the connection between the supporting structure and the objective structure is located substantially further "outwards" than the connection between the mirror body and the supporting structure (with the result that when viewed from the mirror body, any thermally induced tipping movements occur with a correspondingly large radius).

Owing to the design of the projection exposure apparatus according to the disclosure, advantageously the heating of the supporting structure owing to heating of the mirror is reduced. The supporting structure can take up the mirror body with a large distance from the mirror surface centre as a result of which, in comparison with conventional designs, a reduction in thermally induced changes in orientation of the mirror surface results. In addition, a reduction in the effects of any magnetostrictive properties of the supporting structure on the imaging properties of the mirror is also achieved.

The mirror module configured in accordance with the disclosure may be, in particular, the mirror closest to the wafer exposure zone. In this case, it is made possible in accordance with the disclosure to keep disturbances which are coupled into the objective structure and manifest themselves as deformation of the objective structure out of the region of the wafer exposure zone and in addition also to largely eliminate the coupling-in of disruptive interaction effects, in particular electromagnetic fields from the region of the wafer exposure zone.

In embodiments, the objective structure can be manufactured from a material which has a linear coefficient of thermal expansion of less than 0.70 ppmK$^{-1}$ at a temperature of 270K±30K. The objective structure can be manufactured, for this purpose, in particular from iron-nickel alloys, which are marketed under the trademark designation Invar (or Superinvar) (Aperam Alloys Imphy FR).

On the basis of the concept in accordance with the disclosure, it is further possible to manufacture the supporting structure and/or the mirror body from a magnetostrictive material.

The mirror closest to the wafer exposure zone can be arranged in such a way that it causes a light reflection in a direction remote from the wafer exposure zone. The light reflected by this mirror can then be guided on a further mirror and reflected by the further mirror onto the wafer to be exposed. The mirror surface of that mirror which is closer to the wafer exposure zone is preferably smaller than the surface of the following, preferably last, mirror in the beam path. As a result, it is now possible to provide a mirror module for an EUV projection exposure apparatus in which a highly rigid connection of the mirror body to the objective structure in a region which is spaced far apart from the mirror surface can be achieved without the thermal expansion of the mirror body being restricted in the process or the mirror body being deformed by the supporting structure. The operating temperature of the mirror module can be, for example, in the range of from 290 K to 310 K, in particular approximately 300 K.

The supporting structure is preferably characterized by a high level of intrinsic stiffness when mounted at the coupling points with respect to the objective structure with at the same time a low mass. Thus, the first natural frequency of the supporting structure is preferably greater than the first natural frequency of the mirror when mounted at the contact point areas with respect to the rigid part of the supporting structure, wherein the compensation elements belong to the mirror. If the supporting structure is located on the side of the mirror surface, the supporting structure can preferably be constructed in such a way that it includes a basic body which is configured in the manner of a non-circular torus and is therefore closed in the form of a ring. The torus can in this case be configured in such a way that it borders a torus opening, the opening cross section of which is greater than 0.64 times, preferably at least 0.8 to 1.4 times the area proportion of the mirror surface. As a result, the supporting structure, over the course of operation of a corresponding projection exposure apparatus, is not captured or at most is only captured to a small extent by the radiation directed onto the mirror. The contour of the torus opening can in this case be matched in such way that the torus, as far as possible, is not captured by the electromagnetic radiation capturing the mirror body, but has an opening cross section which is as small as possible in order to achieve a high degree of stiffness.

In the case of this torus-like configuration of the supporting structure, it is furthermore advantageously possible to manufacture the coupling sections integrally with the basic body forming the supporting structure so that the coupling sections form an integral component of a highly rigid structure and are therefore also positioned with a high degree of stiffness with respect to one another.

In the projection exposure apparatus according to the disclosure, the objective structure itself includes a material which is different than the material of the mirror body. Owing to the solution concept in accordance with the disclosure, it becomes possible to suspend the mirror such that decoupling elements which are realized as an integral component of a supporting structure and support the mirror are arranged as far as possible from the mirror centre. This approach provides both advantages in terms of magnetostriction since the magnetic fields are usually most pronounced in the vicinity of the mirror and in terms of thermal expansion since the temperature at the mirror is at its greatest owing to mirror heating. In addition, axial expansions at the decoupling or supporting elements which are at a greater distance from one another effect less tipping of the mirror.

The separation of the mirror and the supporting frame is favourable for the manufacture of the mirror and provides cost advantages, both from a manufacturing and installation point of view, over a monolithic embodiment. Any deformations that occur in any case in the region of the joints can in this case be compensated for via a mechanical interface (for example pin geometry, protruding ring shoulder) which at least partially compensates for mechanical stresses.

If during operation of the projection exposure apparatus the mirror body is heated, for example via a heat input from the EUV light, to a greater extent than the supporting structure, stresses which may be caused as a result between the supporting structure and the optical element can be avoided by virtue of the supporting structure also being actively tempered. As a result, any optically relevant deformations of the optical element can be avoided.

In accordance with a further aspect of the present disclosure, local heating, for example of the optical elements, the supporting structure and the holder technology are detected via temperature sensors provided in the region of the mirror module, in particular the supporting structure and the mirror body, in order to avoid or compensate for the resultant potential incorrect positioning or deformation in another way (for example by virtue of feedforward control/regulation of other optical elements).

The mirror can be connected directly to the supporting structure by a cohesive connection, for example final adhesive bonding (without the disclosure being restricted thereto). The decoupling of joining effects takes place via the mentioned geometric interface, for example in the form of a solid or hollow pin which is bordered by an undercut and is manufactured integrally with the mirror body. As an alternative to this, or else in combination with this approach, the output of or reduction in forces acting on the mirror body can also be managed incorporating additional attached elements, in particular bushes.

If the connection of the arm-like coupling sections of the supporting structure to the mirror body takes place via sections of the mirror body which protrude radially from the optically functional region of the mirror surface, it is particularly also possible to reduce the thickness of the mirror body in these connection zones, when measured in the direction of the mirror axis, in such a way that any imposed deformations take place in the weakened region and do not capture the region supporting the mirror surface (or do to a much lesser extent).

The supporting structure is preferably manufactured as a highly rigid component part from a possibly slightly magnetostrictive material. However, it is also possible for the supporting structure to be composed of a plurality of initially at least partially separately manufactured component part sections.

The connection of the supporting structure to the mirror body is preferably performed by virtue of the two component parts being heated initially completely to the operating temperature intended for the operation of the mirror module. Furthermore, the mounting forces required for attachment to the objective structure can be applied to the supporting structure so that the contribution to the deformation thereof does not cause any stresses in the mirror body. In particular, the connection between the mirror body and the supporting structure can be performed by virtue of the component parts being brought into a spatial orientation which corresponds to the installed state and the connection of the components being performed in a loading and stress state, which comes as close as possible to the loading during operation.

In accordance with a further aspect, the disclosure also relates to a method for operating a projection exposure apparatus including a mirror module, which has a mirror body and a supporting structure for connecting the mirror body to an objective structure, in which method, during operation of the projection exposure apparatus, the thermal state of the mirror body is detected, wherein the supporting structure is actively tempered in accordance with the thermal state of the mirror body.

As a result, the thermal deformations of the supporting structure and the mirror body can be synchronized with one another and any optically relevant deformations of the mirror surface supported by the mirror body are avoided.

Within the scope of this method, it is also possible to detect the local heating via temperature sensors at the supporting structure and the mirror body and to avoid or compensate for the resultant potential incorrect position or deformation via regulation.

In the context of the present description, the terms "coefficient of thermal expansion" and "CTE" denote the coefficients of linear expansion of the respective material of the mirror or the supporting structure. This is the material-specific proportionality factor between the change in length and the change in temperature.

If, in the context of the present description, reference is made to a mirror axis or main mirror axis, this is an axis which firstly passes through the area centre of gravity of the mirror surface and secondly is perpendicular to a reference plane specified below. The mentioned reference plane extends substantially parallel to a plane approaching the mirror surface. This reference plane passes through the mirror surface in such a way that, when the mirror surface is projected into the reference plane, the same interspace volumes result for the interspaces on and below the projection between the mirror surface and the reference plane.

Further configurations of the disclosure are set forth in the description and the dependent claims.

The disclosure will be explained in more detail below with reference to exemplary embodiments illustrated in the attached figures.

DETAILED DESCRIPTION OF THE
PREFERRED EMBODIMENTS

Figure 1:
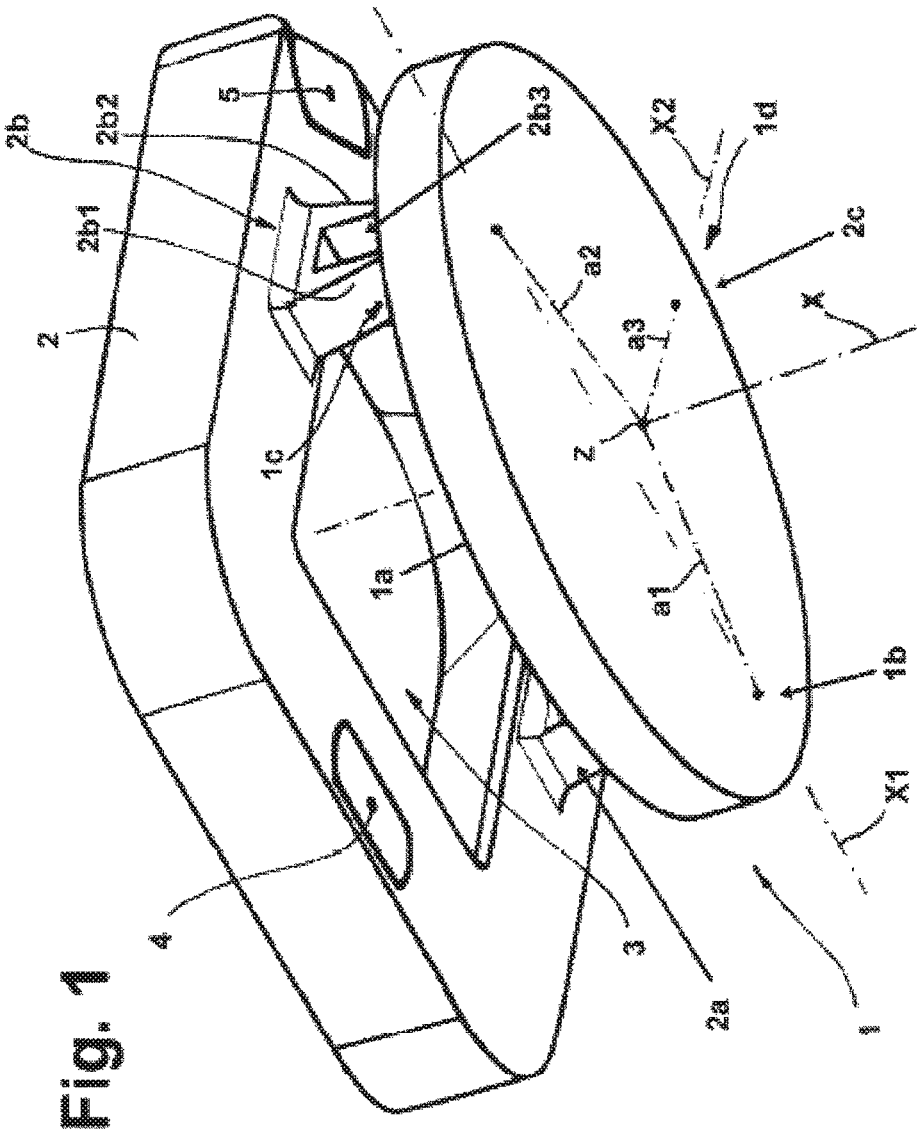
FIG. 1 shows a perspective illustration of a mirror module according to the disclosure including a mirror body and a supporting structure for connecting the mirror body to an objective structure.

FIG. 1 illustrates the design of a mirror module according to the disclosure. This mirror module is part of an EUV projection exposure apparatus and includes a relatively solid mirror body 1 including a mirror surface 1a supported by the mirror body and a supporting structure 2 for connecting the mirror body 1 to an objective structure, which is not shown in any more detail in this illustration (cf., if appropriate, FIG. 3, reference symbol 8). In this mirror module according to the disclosure, the supporting structure 2 and the mirror body 1 are connected to one another via a plurality of coupling sections 2a, 2b, 2c (the coupling section 2c is hidden by the mirror body 1), wherein these coupling sections 2a, 2b, 2c are positioned in such a way that the respective distance a1, a2, a3 thereof from an area centre Z of the mirror surface 1a is greater than 0.8 times the radius of a circle which is equivalent in area to the mirror surface 1a of the mirror body 1.

The mirror module according to the disclosure illustrated here is furthermore designed in such a way that the supporting structure 2 has a basic body configured in the manner of a closed torus. The torus is embodied in such a way that it borders an in this case approximately rectangular torus opening 3, the opening cross section of which is greater than 0.64 times the area part of the mirror surface 1a. The coupling sections 2a, 2b, 2c are in this example formed integrally with the basic body forming the supporting structure. In this respect, the coupling sections consist of the same material as the ring-like basic body of the supporting structure. The material of the mirror body 1 and the material of the supporting structure 2 are matched to one another in such a way that in the vicinity of an operating temperature which is reached during operation of a corresponding EUV projection exposure apparatus whose constituent part is this mirror module, the difference in CTE of the materials is below the value of $0.5*10^{-6}K^{-1}$, preferably below $0.1*10^{-6}K^{-1}$. The operating temperature of the mirror module in this case corresponds to that average material temperature of the mirror body which is set in the mirror body in the connection region of the coupling sections 2a, 2b, 2c. Furthermore, the supporting structure 2 is designed in such a way that it has a greater structural mechanical stiffness than the mirror body 1. In this example, the mirror surface 1a is located on that side of the mirror body 1 which faces the supporting structure 2, and the beam access is via the opening 3 bordered by the supporting structure 2.

In terms of the position and configuration of the connection zones 4, 5, 6 (the connection zone 6 is completely hidden in this illustration by the mirror body 1) to the objective structure, the supporting structure 2 is designed in such a way that the deformation proportions of the connection of the supporting structure 2 to the objective structure resulting as part of the operational forces are transferred to a degree of less than 0.1% to the connection region between the coupling sections 2a, 2b, 2c of the supporting structure 2 and the mirror body 1. The fixing of the supporting structure 2 to the objective structure is performed with as little deformation of the supporting structure 2 as possible in the region of the connection zones 4, 5, 6. The connection zones 4, 5, 6 are so far removed from an area centre of gravity of the mirror surface 1a that they are outside a projection of the optically relevant region of the mirror surface 1a into a reference plane defined by the supporting centres of the connection zones 4, 5, 6.

Figure 2:
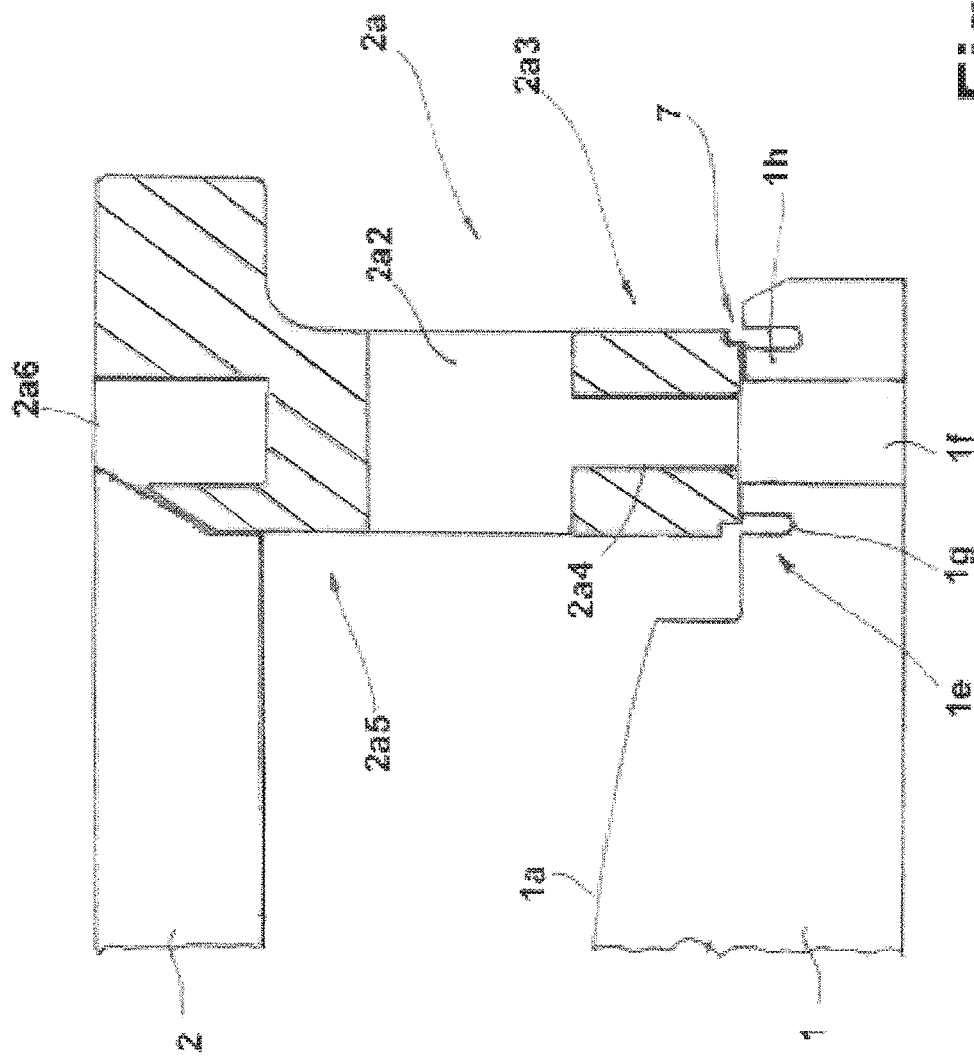
FIG. 2 shows a simplified sectional illustration for illustrating the design of the mirror module in the region of the coupling sections which couple the supporting structure and the mirror body.

As will be mentioned in further detail in connection with FIG. 2, a coupling geometry for the output of or reduction in stresses which result over the course of adhesive bonding or another type of connection of the mirror body 1 to the supporting structure 2 is formed in the mirror body 1 in the region of the respective connection to a coupling section 2a, 2b, 2c of the supporting structure 2. The coupling sections 2a, 2b, 2c are preferably configured, as illustrated, as arm sections which are formed integrally with the supporting structure 2. In the exemplary embodiment illustrated here, the respective arm sections form a so-called bipod structure having two limbs 2b1, 2b2 set at an angle with respect to one another and delimiting a through-opening 2b3.

As a deviation from the embodiment illustrated here, the mirror body 1 can also be configured in such a way that it has a noncircular cross section, when viewed from the direction of a mirror axis X passing through the area centre of gravity of the mirror surface 1a. The sections 1b, 1c, 1d of the mirror body 1 which are connected in this case to the coupling sections 2a, 2b, 2c of the supporting structure 2 can then be embodied, for example, as radially projecting supporting sections, which in the process project radially beyond the projection of the torus opening 3 into a plane normal to the mirror axis X.

The coupling sections 2a, 2b of the supporting structure 2 which support the mirror body 1 are located on opposite sides of the supporting structure with respect to one another in relation to the torus opening 3. The connection of the mirror body 1 to those coupling sections 2a, 2b is preferably performed as illustrated here, namely in a region of the mirror body 1 which is outside a normal projection of the torus opening 3 onto the mirror body 1. In the case of a noncircular configuration of the outer contour of the mirror body, these regions of the mirror body 1 which are connected to the coupling sections 2a, 2b, and possibly also 2d, can be configured in such a way that they act as sections 1b and 1c which bulge out locally in the form of lugs. These coupling sections 2a, 2b define a suspension axis X1. The coupling sections 2a, 2b realized here as bipods are configured in such a way that there is a certain degree of tipping freedom about this suspension axis X1. The then statically determined fixing of the mirror body 1 against tipping about this axis X1 is achieved by the third coupling section 2c, which is hidden in this illustration. The geometric arrangement of this third coupling section 2c is preferably such that the centre of the system of forces supporting the mirror body 1 in the region of the third coupling section 2c is located on an axis X2, wherein this axis X2 in this case extends in a plane which is normal to the axis X1 and in this case extends centrally between the supporting centres of the coupling sections 2a, 2b.

The connection of the supporting structure 2 to the objective structure (not illustrated in any further detail here) is performed via three connection regions 4, 5, 6. The coupling of the supporting structure 2 to the mirror body 1 is preferably likewise performed via three connection regions, as described.

FIG. 2 shows, in the form of a detail illustration, in section, the design of the mirror module according to the disclosure in the region of a coupling section 2a. This description applies also to the design of the mirror module in the region of the further coupling sections 2b and 2c illustrated in FIG. 1.

The basic body of the supporting structure 2 is axially offset with respect to the mirror body 1. The offset distance is bridged by the respective coupling section, in this case the coupling section 2a. The coupling section 2a is preferably formed integrally with the basic body of the supporting structure 2, as illustrated here, and is in this case configured as a bipod. This bipod forms two limbs, of which only the "rear" limb 2a2 can be seen in this illustration. These limbs are preferably arranged inclined ("at an angle") with respect to one another, as illustrated, and are connected to one another via a bridge head section 2a3.

The bridge head section 2a3 is connected to the mirror body 1 via a joint 7. A special geometry used for outputting stresses, in this case by way of example in the form of a cylindrical undercut 1e, is realized in the mirror body 1 in the vicinity of the joint 7. This special geometry illustrated merely by way of example here effects a reduction in deformations of the mirror body 1 in the region of the mirror surface 1a which are caused by any local stresses in the region of the joint 7. In this exemplary embodiment, the joint 7 extends along a ring surface, which is delimited by the undercut 1e and a mirror bore 1f, which is aligned with the bore 2a4. The base region 1g of the undercut is rounded. As an alternative to the configuration shown here of the undercut 1e, it is also possible for this undercut 1e to be configured in such a way that the pin 1h bordered by the undercut is delimited on the outside by a noncylindrical lateral surface, in particular a cone area.

It is possible to insert a pin element into the bores 2a4, if illustrated here, which pin element is in particular manufactured from a material whose coefficient of thermal expansion in the relevant temperature range corresponds to the coefficient of thermal expansion of the mirror body 1. At least one temperature sensor and possibly also a heating device can be connected to the limb 2a2, which heating device enables detection of the temperature of the limb 2a2 and possibly active temperature control thereof. The coupling section 2a is coupled to the ring torus of the supporting structure via a foot region 2a5. On a side of the ring torus which is remote from the foot region 2a5, a depression 2a6 is formed into the ring torus, which depression reduces the stiffness of the supporting structure 2 in this region in comparison with a completely filled design.

In the variant shown here, the connection of the coupling section 2a to the mirror body 1 takes place via butt-adhesive bonding. It is possible to provide complementary geometries in this connecting region between the coupling section 2a and the mirror body 1, by which complementary geometries the structural mechanical properties of this connection point can be adjusted further. These complementary geometries can be embodied in particular as circular-symmetrical axial profiles with respect to a supporting centre of the connecting region. In this region, further intermediate elements can also be provided, which as such favour the loading of component parts which is required for the transmission of the operating forces in respect of the material stresses and deformations occurring in the process or at least influence such loading in such a way that as little deformation as possible occurs in the optically functional region of the mirror surface 1a.

Figure 3:
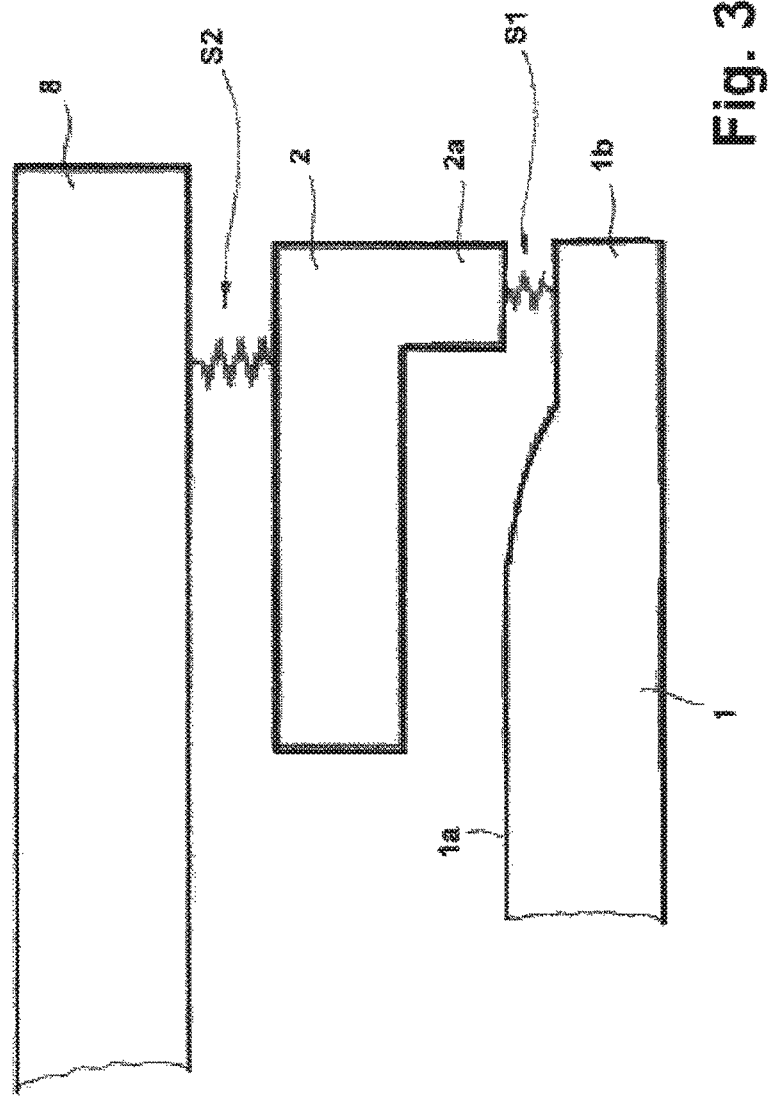
FIG. 3 shows a schematic illustration illustrating in further depth the concept in accordance with the disclosure of the connection of a mirror body to an objective structure.

FIG. 3 shows, in the form of a schematic illustration, the concept of the connection of a mirror body 1 to an objective structure using a supporting structure configured in accordance with the disclosure in more detail. The mirror body 1 and the supporting structure 2 form a mirror module, which is fastened to an objective structure 8 of an EUV projection exposure apparatus via the supporting structure 2. The difference in the coefficients of thermal expansion of the materials used here for the supporting structure 2 and the mirror body 1 is less than $0.5*10^{-6}K^{-1}$, preferably less than $0.1*10^{-6}K^{-1}$ at the operating temperature.

The mirror body 1 forms a connection geometry which is integrally formed in the mirror body itself (for example as illustrated in FIG. 2 in the form of an undercut or pin), which further reduces the deformations owing to the connection to the supporting structure 2. The stiffness of the system in the region of the connection geometry of the supporting structure 2 and the mirror body 1 is symbolized as spring S1 here. The supporting structure 2 has a high degree of structural mechanical stiffness. This stiffness is adjusted in such a way that preferably only proportions <0.1% of any deformations from the region for connection to the objective structure 8 are transmitted into the region of the respective joint with respect to the mirror body 1. The supporting structure 2 preferably has a higher degree of structural mechanical stiffness than the mirror body 1. The mirror body 1 is preferably directly connected to the supporting structure 2 via a joint, as illustrated here. The decoupling from local joining effects is performed via the mentioned geometric interface, for example in the form of a pin which is bordered by an undercut and is manufactured integrally with the mirror body 1 and extends in the radially bulging section 1b of the mirror body 1.

The position of the connection point between the mirror body and the supporting structure 2 is selected such that the connection point achieves as great a distance as possible from the mirror centre and in addition as great a distance as possible from the region of the mirror body which is actively illuminated by the EUV radiation. The supporting structure 2 is overall configured in such a way that it combines the coupling sections 2a (2b, 2c) with high stiffness, wherein, if appropriate, a ring-like structure extends as completely as possible outside a region still captured by the EUV radiation on a side of the mirror body 1 which faces the mirror surface 1a.

The connection of the supporting structure 2 to the objective structure 8 is symbolized by the spring symbol S2.

The connection of the mirror body 1 to the supporting structure 2 is performed in the embodiment illustrated via at least three supporting connection points. The connection of the supporting structure 2 to the objective structure 8 is likewise performed via at least three connection points.

Figure 4:
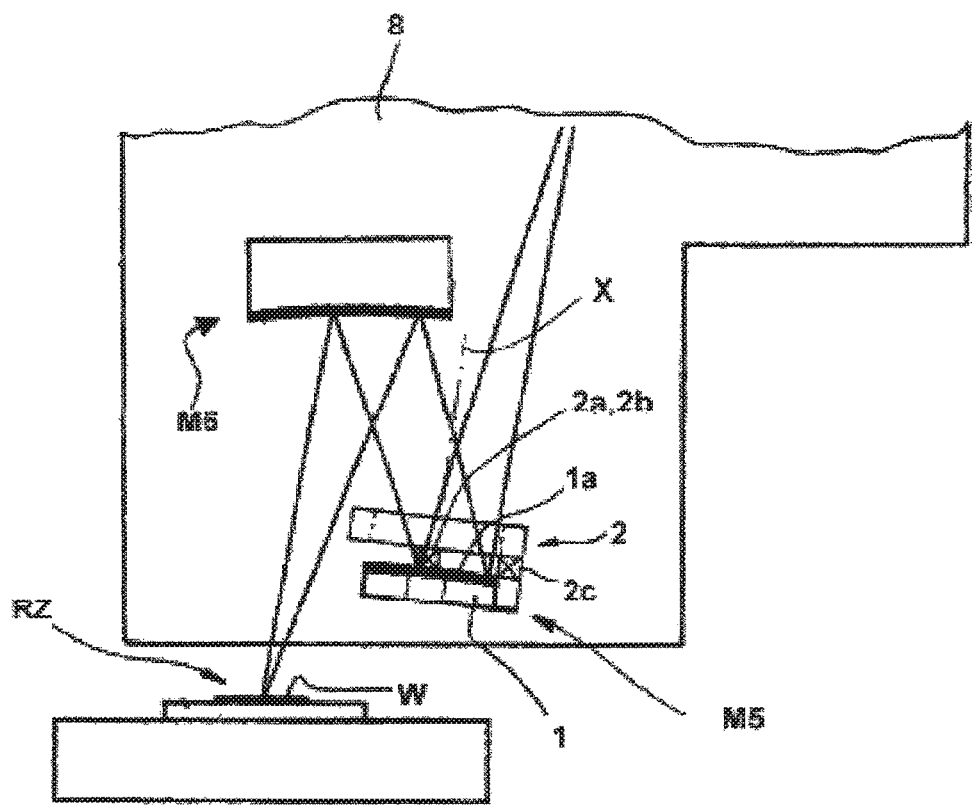
FIG. 4 shows a schematic illustration for illustrating the design of a microlithographic projection exposure apparatus in the region of the last two mirrors of the beam path.

The illustration shown in FIG. 4 shows the design of a microlithographic projection exposure apparatus for exposing a wafer W in a wafer exposure zone RZ. The projection exposure apparatus in this case includes an objective structure 8 and a mirror arrangement including a plurality of mirrors M5, M6, which are arranged at different distances from that wafer exposure zone RZ. In the projection exposure apparatus according to the disclosure, that mirror M5 of the mirror arrangement which has the shortest distance from the wafer exposure zone RZ with respect to the position of its mirror surface 1a is provided by a mirror module, which includes a mirror body 1 having a mirror surface 1a, and a supporting structure 2 for connecting the mirror body 1 to the objective structure 8. The connection of the supporting structure 2 to the objective structure 8 takes place in a region which is spaced further apart from the wafer exposure zone RZ than the mirror surface 1*a* is from the wafer exposure zone RZ. The "distance from the wafer exposure zone" should in this context be understood to mean the shortest distance resulting between a point on the wafer exposure zone and a point on the mirror surface 1*a*.

The mirror module which includes the mirror M5 bears the mirror with the shortest distance from the wafer exposure zone RZ. This mirror module includes the mentioned supporting structure 2. The supporting structure 2 forms a first connection for connecting the mirror body 1 of the mirror M5 to the supporting structure 2. The supporting structure 2 in addition forms a second connection for connecting the supporting structure 2 to the objective structure 8.

The second connection of the supporting structure 2 to the objective structure 8 is located in a region which is spaced further apart from the wafer exposure zone RZ than the mirror surface 1*a* is from the wafer exposure zone RZ. The connection of the supporting structure 2 to the objective structure 8 can in this case preferably take place in a region which is spaced apart from the wafer exposure zone RZ by between 1.5 times and 5 times the shortest distance by which the mirror surface 1*a* is spaced apart from this wafer exposure zone RZ.

Furthermore, advantageously the connection of the supporting structure 2 to the objective structure 8 can be effected in such a way that the magnitude of the difference between the distance of the first and second connections from the wafer exposure zone RZ is less than four times the mentioned smallest distance of the mirror surface 1*a* from the wafer exposure zone RZ.

The connection of the supporting structure 2 to the objective structure 8 can furthermore take place in particular at a distance from the wafer exposure zone which is greater than the distance of the mirror surface 1*a* from the wafer exposure zone RZ by a clearance, wherein this clearance preferably corresponds to at least the average thickness of the mirror body 1, measured transversely to the mirror surface 1*a*.

In the exemplary embodiment shown here, the supporting structure 2 and also the mirror body are manufactured from a non-magnetostrictive glass ceramic material. However, it is also possible for in particular the supporting structure to be manufactured from a material possibly having magnetostrictive properties since, on the basis of the suspension concept of the mirror body 1 according to the disclosure, the supporting structure has a large distance from the wafer exposure zone RZ.

In the exemplary embodiment illustrated, light reflection takes place in a direction remote from the wafer exposure zone RZ via the mirror M5 of the mirror arrangement which is most closely adjacent to the wafer exposure zone RZ. The mirror module forming the penultimate mirror M5 in the beam path is designed in such a way that the supporting structure 2 and the mirror body 1 are connected to one another via a plurality of coupling sections 2*a*, 2*b*, 2*c*, and these coupling sections 2*a*, 2*b*, 2*c* are spaced radially apart from a surface centre of the mirror surface 1*a* with respect to the mirror axis X, wherein the material of the mirror body 1 and the material of the supporting structure 2 are matched to one another in such a way that, in the vicinity of an operating temperature which is reached by the mirror module during its operation within the projection exposure apparatus in the region of the coupling sections 2*a*, 2*b*, 2*c*, the difference in CTE of the materials is below the value of $0.5*10^{-6}K^{-1}$. The vicinity of this temperature preferably has a width of ±25 K with respect to the average temperature which occurs during operation of the projection exposure apparatus in the region of the coupling sections.

In accordance with a further aspect of the present disclosure, it is advantageously possible to determine the internal temperature distribution resulting for the mirror body and the supporting structure during operation of the projection exposure apparatus or to simulate this temperature distribution computationally, and then to determine and/or calculate the thermal deformations of the supporting structure and the mirror body for operationally possible deviations in the temperature distribution and/or to model the deformations approximately and then to match the CTE properties of the mirror body and the supporting structure to one another in such a way that a synchronous maximum of the thermally induced changes in position i.e. a synchronism that is as similar as possible of the regions of the mirror body and the supporting structure which are connected to one another or are closely adjacent to one another, results for these deviations in the temperature distribution. This synchronism is preferably determined for a load state which corresponds to the load state of the supporting structure and the mirror body in the installed state.

The mirror body and the supporting structure are first manufactured as separate structures and are connected to one another, and geometric structures, for example in the form of the described undercut, are formed in the region of the component part zones which are used for connecting the supporting structure to the mirror body, which geometric structures serve the purpose of avoiding or reducing deformations of the mirror body in its region supporting the mirror surface if the deformations result from force systems which result from the connection of the supporting structure to the mirror body.

If the disclosure has also been described with reference to specific embodiments, numerous variations and alternative embodiments, for example as a result of combination and/or replacement of features of individual embodiments, are revealed to a person skilled in the art. Correspondingly, it is obvious to a person skilled in the art that such variations and alternative embodiments of the present disclosure are also included, and the scope of the disclosure is only restricted in the sense of the attached patent claims and the equivalents thereof.

LIST OF REFERENCE SYMBOLS

1 Mirror body
1*a* Mirror surface
1*b* Section
1*c* Section
1*d* Section
1*e* Undercut
1*f* Mirror bore
1*g* Base region
1*h* Pin
2 Supporting structure
2*a* Coupling section
2*b* Coupling section
2*c* Coupling section
2*a*2 Limb
2*b*1 Limb
2*b*2 Limb
2*b*3 Through-opening
2*a*3 Bridge head section 2a4 Bore
2a5 Foot region
2a6 Depression
3 Torus opening
4 Connection zone
5 Connection zone
6 Connection zone
7 Joint
8 Objective structure
a1 Distance
a2 Distance
a3 Distance
M5 Mirror
M6 Mirror
RZ Wafer exposure zone
S1 Spring
S2 Spring symbol
W Wafer
X Main mirror axis
X1 Suspension axis
X2 Axis

What is claimed is:

1. An apparatus, comprising:
a mirror module which comprises a mirror, the mirror comprising a mirror body and an optically effective surface; and
a supporting structure,
wherein:
the mirror body comprises a first material having a coefficient of thermal expansion;
the supporting structure comprises a second material having a coefficient of thermal expansion;
the supporting structure is connected to the mirror body via a first connection;
the supporting structure is configured to be connected to an objective structure via a second connection;
the coefficient of thermal expansion of the first material differs from the coefficient of thermal expansion of the second material by less than $0.5*10^{-6}K^{1}$ during operation in a temperature range around an operating temperature of the mirror module in a region of the first connection;
the supporting structure is configured so that, during operation, less than 0.1% of deformations occurring in the second connection are transferred to the first connection;
a minimum spacing between the second connection and the center point of the optically effective surface is at least 1.5 times greater than a minimum spacing between the first connection and the optically effective surface of the mirror; and
the apparatus is a microlithographic projection exposure apparatus.

2. The apparatus of claim 1, wherein the minimum spacing between the second connection and the center point of the optically effective surface is at least two times greater than the minimum spacing between the first connection and the optically effective surface of the mirror.

3. The apparatus of claim 1, wherein the minimum spacing between the second connection and the center point of the optically effective surface is at least three times greater than the minimum spacing between the first connection and the optically effective surface of the mirror.

4. The apparatus of claim 1, wherein the coefficient of thermal expansion of the first material differs from the coefficient of thermal expansion of the second material by less than $0.3*10^{-6}K^{-1}$ during operation in a temperature range around an operating temperature of the mirror module in a region of the first connection.

5. The apparatus of claim 1, wherein the coefficient of thermal expansion of the first material differs from the coefficient of thermal expansion of the second material by less than $0.1*10^{-6}K^{-1}$ during operation in a temperature range around an operating temperature of the mirror module in a region of the first connection.

6. The apparatus of claim 1, wherein the temperature range is ±10 K of the operating temperature.

7. The apparatus of claim 1, wherein the temperature range is ±5 K of the operating temperature.

8. The apparatus of claim 1, wherein the temperature range is ±1 K of the operating temperature.

9. The apparatus of claim 1, wherein the first material is different from the second material.

10. The apparatus of claim 1, wherein the second material has a stiffness that is at least 1.1 times greater than a stiffness of the first material.

11. The apparatus of claim 1, wherein the second material has a stiffness that is at least 1.2 times greater than a stiffness of the first material.

12. The apparatus of claim 1, wherein the second material has a stiffness that is at least 1.5 times greater than a stiffness of the first material.

13. The apparatus of claim 1, further comprising a decoupling element between the supporting structure and the mirror body.

14. The apparatus of claim 1, wherein the first material comprises titanium-doped quartz glass or Zerodur.

15. The apparatus of claim 1, wherein the second material comprises cordierite, Zerodur or amorphous quartz glass.

16. The apparatus of claim 1, wherein the mirror module is configured for an operating wavelength of less than 30 nm.

17. An apparatus, comprising:
an objective structure;
a mirror module which comprises a mirror, the mirror comprising a mirror body and an optically effective surface; and
a supporting structure configured to connect the mirror body to the objective structure,
wherein:
the mirror body comprises a first material having a coefficient of thermal expansion;
the supporting structure comprises a second material having a coefficient of thermal expansion;
the first material is different from the second material;
the second material has a stiffness that is at least 1.1 times greater than a stiffness of the first material;
the supporting structure is connected to the mirror body via a first connection;
the supporting structure is connected to the objective structure via a second connection;
the coefficient of thermal expansion of the first material differs from the coefficient of thermal expansion of the second material by less than $0.5*10^{-6}K^{-1}$ in a temperature that is ±10K an operating temperature of the mirror module during operation in a region of the first connection;
the supporting structure is configured so that, during operation, less than 0.1% of deformations occurring in the second connection are transferred to the first connection;
a minimum spacing between the second connection and the center point of the optically effective surface is at least 1.5 times greater than a minimum spacing between the first connection and the optically effective surface of the mirror; and the apparatus is a microlithographic projection exposure apparatus.

18. The apparatus of claim 17, wherein:

the first material comprises titanium-doped quartz glass or Zerodur; and the second material comprises cordierite, Zerodur or amorphous quartz glass.

19. The apparatus of claim 17, further comprising a decoupling element between the supporting structure and the mirror body.

20. The apparatus of claim 1, wherein:

the apparatus has a wafer exposure zone;

the second connection is in a region which is spaced a first distance from the wafer exposure zone;

the optically effective surface of the mirror is spaced a second distance from the wafer exposure zone; and the first distance is greater than the second distance.

* * * * *

UNITED STATES PATENT AND TRADEMARK OFFICE
CERTIFICATE OF CORRECTION

PATENT NO. : 9,996,015 B2
APPLICATION NO. : 15/432082
DATED : June 12, 2018
INVENTOR(S) : Jens Prochnau et al.

Page 1 of 1

It is certified that error appears in the above-identified patent and that said Letters Patent is hereby corrected as shown below:

On the Title Page

Column 1, (54) title, Line 3, delete "APPARARATUS" and insert -- APPARATUS --.

Column 1, (*) Notice:, Line 3, after "0 days." delete "days.".

Page 2, under Foreign Patent Documents, Line 1, delete "10 2012 202 1" and insert -- 10 2012 202 167 A1 --.

In the Specification

Column 1, Line 3, delete "APPARARATUS" and insert -- APPARATUS --.

In the Claims

Column 13, Line 39, in Claim 1, delete "K$^1$" and insert -- K$^{-1}$ --.

Signed and Sealed this
Sixteenth Day of April, 2019

Andrei Iancu
*Director of the United States Patent and Trademark Office*